United States Patent [19]

Inoue

[11] Patent Number: 5,244,556
[45] Date of Patent: Sep. 14, 1993

[54] METHOD FOR DEPOSITING THIN FILM ON SUBSTRATE BY SPUTTERING PROCESS

[75] Inventor: Minoru Inoue, Kawasaki, Japan

[73] Assignee: Fujitsu Limited, Kawasaki, Japan

[21] Appl. No.: 762,359

[22] Filed: Sep. 19, 1991

[30] Foreign Application Priority Data

Sep. 20, 1990 [JP] Japan .................................. 2-252528

[51] Int. Cl.$^5$ .............................................. C23C 14/34
[52] U.S. Cl. .......................... 204/192.12; 204/298.09; 204/298.12
[58] Field of Search ....................... 204/192.12, 298.09, 204/298.12, 298.13

[56] References Cited

U.S. PATENT DOCUMENTS

| | | | |
|---|---|---|---|
| 4,049,523 | 9/1977 | Boehnke et al. | 204/192.12 |
| 4,324,631 | 4/1982 | Meckel et al. | 204/192.2 |

FOREIGN PATENT DOCUMENTS

| | | | |
|---|---|---|---|
| 63-45368 | 2/1988 | Japan | 204/298.12 |
| 63-270459 | 11/1988 | Japan | 204/298.12 |
| 1-132760 | 5/1989 | Japan | 204/298.09 |
| 1-283368 | 7/1989 | Japan | 204/298.13 |
| 1-283367 | 10/1989 | Japan | 204/298.13 |
| 2-166274 | 6/1990 | Japan | 204/298.09 |

OTHER PUBLICATIONS

Patent Abstracts of Japan, vol. 12, No. 263 (C-514)(3110) 22 Jul. 1988 & JP-A-63 045368 (Toshiba Corp) 26 Feb. 1988.
Patent Abstracts of Japan, vol. 13, No. 84 (C-572)(3432) 27 Feb. 1989 & JP-A-63 270459 (Matsushita Electric Ind Ltd) 8 Nov. 1988.
Patent Abstracts of Japan, vol. 13, No. 384 (C-629)(3732) 24 Aug. 1989 & JP-A-1 132760 (Matsushita Electric Ind Ltd) 25 May 1989.
Patent Abstracts of Japan, vol. 14, No. 431 (C-759)(4374) 17 Sep. 1990 & JP-A-2 166274 (Misubishi Electric Corp) 26 Jun. 1990.

Primary Examiner—Aaron Weisstuch
Attorney, Agent, or Firm—Staas & Halsey

[57] ABSTRACT

There is disclosed a method for depositing a thin film on a substrate placed in a chamber by a sputtering process in which a target mounted on a cathode assembly is sputtered under predetermined ambient conditions in the chamber. The method includes the steps of: mounting a target, which is formed of a backing plate and a target plate directly connected to the backing plate, on the cathode assembly, the backing plate having a heat conductivity greater than that of the target plate; heating the target at a predetermined temperature at which residual gases absorbed on the target plate are removed therefrom; and activating the cathode assembly so that the target plate is sputtered. The target can also be formed of a backing plate, a spacer directly connected to the backing plate, and a target plate directly connected to the spacer, the spacer having a melting point greater than that of the target plate.

12 Claims, 4 Drawing Sheets

METHOD FOR DEPOSITING THIN FILM ON SUBSTRATE BY SPUTTERING PROCESS

BACKGROUND OF THE INVENTION

(1) Field of the invention

The present invention generally relates to a method for depositing a thin film on a substrate by a sputtering process, and more particularly to a method for depositing a thin film on a substrate by a sputtering process in which a high quality thin film can be stably deposited on the substrate at a high sputtering rate.

(2) Description of related Art

In semiconductor devices, magnetic devices, optical devices, and the like, each of which has a thin film formed of nonmagnetic metal or magnetic metal, the thin film is deposited on a substrate by a sputtering process. The characteristics of the thin film deposited on the substrate depend on the ambient conditions under which the sputtering is performed. Thus, the thin film is deposited on the substrate under conditions in which residual gases, such as water vapor, which cause the quality of the thin film to deteriorate, are completely removed from the chamber in which the sputtering process is performed.

Recently, it has been required that thin films whose quality is as high as possible, be formed on the substrate. To achieve the requirement in the sputtering process which is performed in a chamber in which an inert gas such as argon is filled, the amount of residual of residual gas must be decreased and the thin film must be deposited on the substrate at a high sputtering rate so that the sputtering process can be completed in a short time. In another type of sputtering process in which a thin film formed of a nitride or an oxide is deposited on the substrate, a reactive gas such as nitrogen or oxygen is supplied with the inert gas to the chamber in which the sputtering process is performed. In this case, to obtain a high quality thin film, the amount of the reactive gas supplied to the chamber must be determined. This is, to deposit the thin film on the substrate at a high sputtering rate, an amount of the reactive gas which is proportional to the sputtering rate must be supplied to the chamber. As the discharge voltage in the reactive gas is higher than that in an inert gas such as argon, when the amount of the reactive gas in the chamber is too large, it is difficult for the discharge to be normally performed in the chamber. As used herein, the discharge voltage means the voltage at which the flow discharge starts. Thus, the amount of reactive gas supplied to the chamber, in which the thin film is deposited on the substrate by the sputtering process, must be optimally controlled.

In a conventional method for depositing a thin film on a substrate by a sputtering process, a sputtering device shown, for example, in FIG. 1 is used. Referring to FIG. 1, a target 30 is mounted on a cathode assembly 3 by screws 17a and 17b. The target 30 is formed of a backing plate 33 and a target plate 31 to be sputtered. The target plate 31 is adhered to the backing plate 33 by a solder 34 of metal having a low melting point. The backing plate 33 is made, for example, of copper or copper alloy, and the solder 34 is made of a material having a melting point of approximately 200° C., such as indium alloy or tin alloy. This melting point of the solder 34 is less than that of the target plate 31. The cathode assembly 3 has a support frame 13b having a flange 3a which is formed on a lower end of the support frame 3b. Magnets, electromagnets 5 and other parts of the sputtering device are mounted in the support frame 3b. A flow path 9 is formed around the magnets, the electromagnets 5 and the like in the support frame 3b. A heat exchanging medium 2a, such as water, is supplied via an inlet 6a to the flow path 9. The heat exchanging medium 2a flows through the flow path 9 and is withdrawn from an outlet 6b. The target 30 is mounted on the cathode assembly 3 via a sealing member 4 (an O-ring) so that the rear surface of the backing plate 33 is in contact with the heat exchanging medium 2a. A chamber 10 in which a substrate is placed is provided so as to be connected to the support frame 3b.

In the above sputtering device, to prevent the solder 34 from melting, the target plate 31 is cooled by the heat exchanging medium 2a (e.g. water) via the backing plate 33 while the sputtering deposition is being performed. Thus, the target plate 31 is sputtered at a relatively lower temperature, such as a temperature less than approximately 150° C.

While the target plate 31 is being sputtered in the chamber 10 which is filled with the argon gas, the thin film, made of atoms of the target plate 31, is being deposited on the surface of the substrate which is placed so as to face the target plate 31. If a reactive gas, such as nitrogen or oxygen, is in the chamber 10, the sputtering is performed under a condition in which absorption of the reactive gas occurs on the surface of the target plate 31. In this case, a nitride thin film or an oxide thin film is deposited on the surface of the substrate.

FIG. 2 shows an example of target in which solder, a brazing filler metal having a low melting point is not used. Referring to FIG. 2, the target plate 31 is directly mounted on the flange 3a of the support frame 3b by the respective screws 17a and 17 b via the sealing member 4 (the O-ring). Thus, the target plate 31 is directly cooled by cooling water (the heat exchanging medium).

In the case where the thin film is deposited on the substrate by the sputtering device shown in FIG. 1, the target plate 31 is sputtered at a relatively low temperature, as has been described above. Thus, there may be a case where the sputtering starts under a condition where physical absorption of residual gases such as water vapor occurs on the surface of the target plate. In this case, as the water vapor is diffused from the target out into the chamber when the sputtering is performed, the quality of the thin film deposited on the substrate deteriorates.

In addition, if the sputtering is performed under conditions where a reactive gas is in the chamber 10, the following disadvantage occurs. If the target plate 31 has a low temperature, the partial pressure of the reactive gas in the chamber 10 must be increased to perform the sputtering at a high sputtering rate. However, when the amount of the reactive gas in the chamber 10 is increased so that the partial pressure of the reactive gas is increased, it becomes difficult for the discharge to occur in the chamber 10. Therefore, when the sputtering is performed at a low temperature, it is difficult for the thin film of the nitride or the oxide to be stably deposited on the substrate at a high sputtering rate.

In a case where the thin film is deposited on the substrate by sputtering in which the target shown in FIG. 2 is used, as the target plate 31 is directly mounted on the cathode assembly 3, the power which can be supplied to the target plate 31 for the sputtering depends on the thermal conductivity of the target plate 31 itself. That is, the greater the thermal conductivity of the target plate 31, the larger the amount of power which can be supplied to the target plate 31. Thus, when a target plate 31 having a low thermal conductivity, such as a silicon plate, is used for the sputtering, the power which is supplied from the cathode assembly 3 to the target plate 31 must be limited. In this case, it is difficult for the sputtering to be performed at a high sputtering rate.

SUMMARY OF THE INVENTION

Accordingly, a general object of the present invention is to provide a novel and useful method for depositing a thin film on a substrate by a sputtering process in which the disadvantages of the aforementioned prior art are eliminated.

A more specific object of the present invention is to provide a method for depositing a thin film on a substrate by a sputtering process in which the thin film can be stably deposited on the substrate at a high sputtering rate.

Another object of the present invention is to provide a method for depositing a thin film on a substrate by a sputtering process in which the thin film deposited on the substrate can be of high quality.

The above objects of the present invention are achieved by a method for depositing a thin film on a substrate placed in a chamber by a sputtering process in which a target set on a cathode assembly is sputtered under predetermined ambient conditions in the chamber, said method comprising the following steps (a) through (c) of: (a) mounting the target, which is formed of a backing plate and a target plate directly connected to said backing plate, on the cathode assembly, said backing plate having a heat conductivity greater than that of said target plate; (b) heating said target at a predetermined temperature at which residual gases absorbed on said target plate are removed therefrom; and (c) activating said cathode assembly so that said target plate is sputtered.

According to the present invention, the target is intentionally heated at a predetermined temperature so that the residual gases absorbed on the target plate are removed. Thus the quality of the thin film deposited on the substrate can be improved.

In the case where reactive gas is supplied to the chamber, when the target plate is intentionally heated, the reactive gas which is absorbed on the target plate can be easily reacted. Thus, the thin film, which includes a component derived from the reactive gas, can be stably deposited on the substrate at a high sputtering rate.

Additional objects, features and advantages of the present invention will become apparent from the following detailed description when read in conjunction with the accompanying drawings.

DESCRIPTION OF THE PREFERRED EMBODIMENT

A description will now be given of an embodiment of the present invention.

Figure 1:
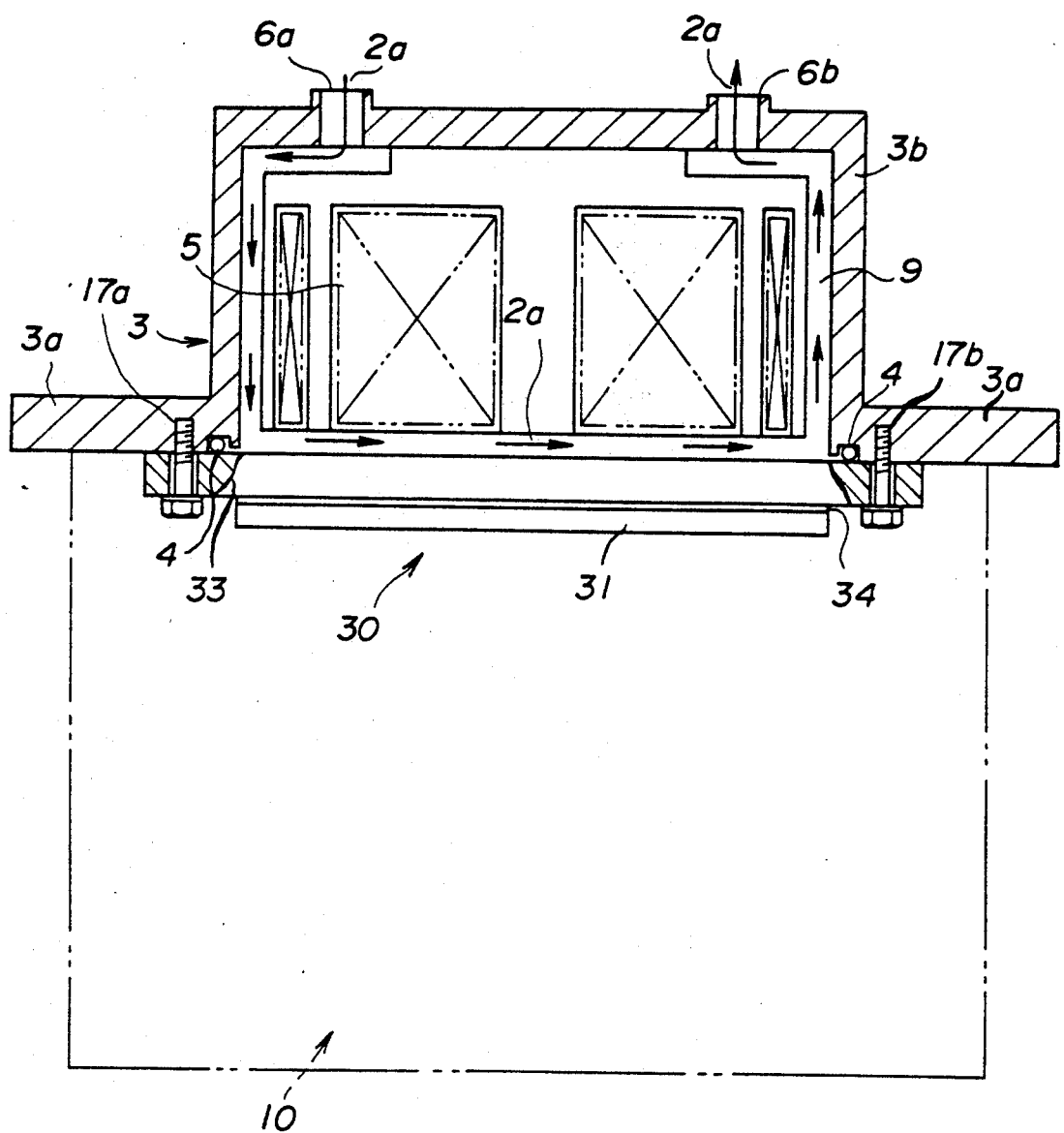
FIG. 1 is a diagram illustrating a conventional sputtering device.
Figure 3:
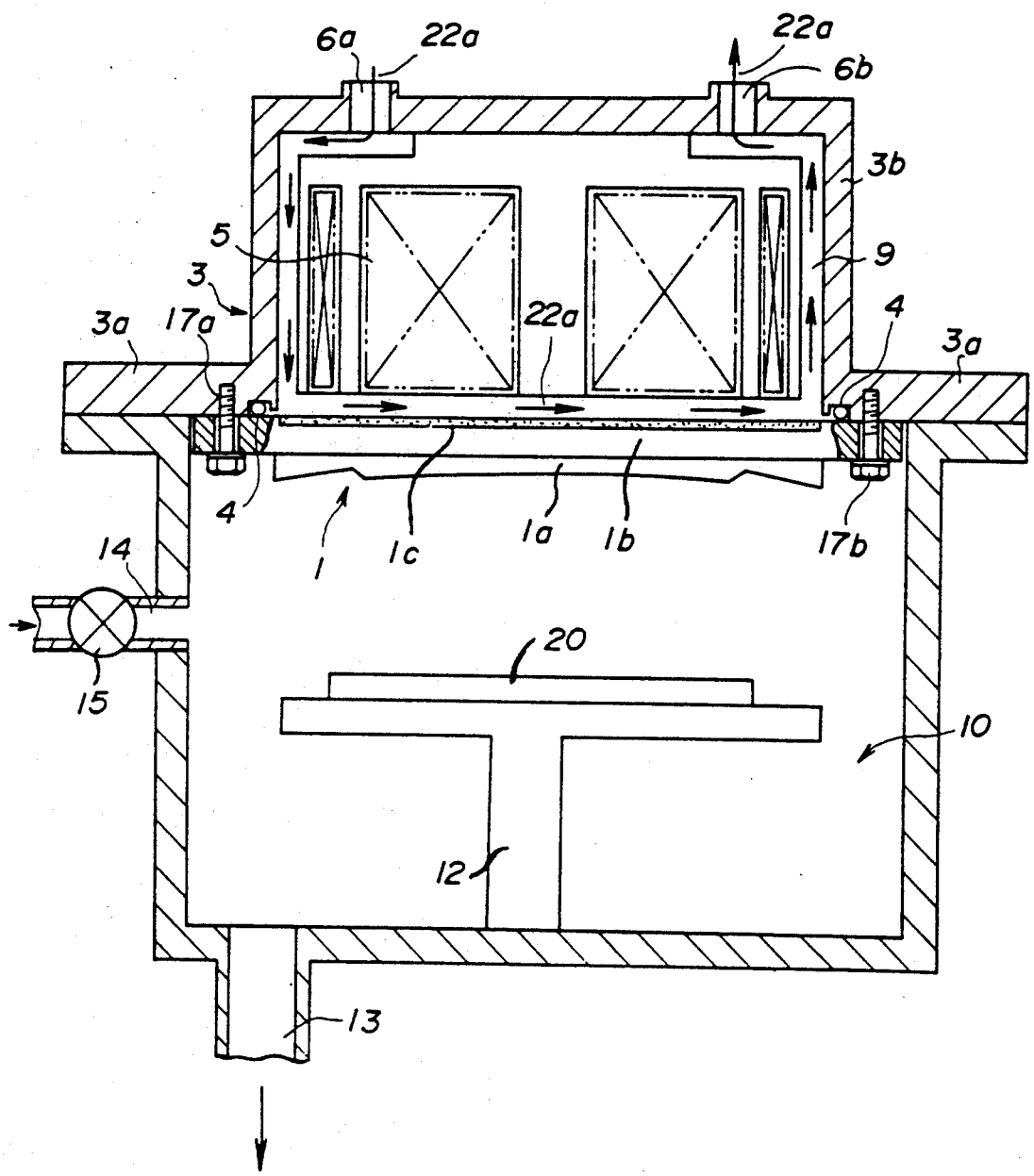
FIG. 3 is a diagram illustrating a sputtering device used in a process for depositing a thin film on a substrate according to an embodiment of the present invention.

FIG. 3 shows a sputtering device which is used in a sputtering process according to this embodiment of the present invention. In FIG. 3, those parts which are the same as those shown in FIG. 1 are given the same reference numbers. Referring to FIG. 3, a target 1 is mounted on the cathode assembly 3. The cathode assembly 3 has the support frame 3b having the flange 3a formed on the lower end thereof. The magnets, the electromagnets 5 and the other parts of the sputtering deposition device are mounted in the support frame 3b. The flow path 9 is formed in the support frame 3b in the same manner as that shown in FIG. 1. A heat exchanging medium 22a flows in the flow path 9. The target 1 is fixed via the sealing member 4 on the flange 3a of the support frame 3b by the respective screws 17a and 17b so that the heat exchange medium 22a is in contact with the target 1. The flange 3a of the support frame 3b is fixed on the chamber 10, so that the cathode assembly 3, on which the target 1 is fixed, is mounted on the chamber 10. A support table 12 is provided in the chamber 10 and a substrate 20 is placed on the support table 12 so as to face the target 1. An exhaust pipe 13 and an inlet pipe 14 on which a valve 15 is provided are respectively connected to the chamber 10. The chamber 10 is exhausted via the exhaust pipe 13 by a cryopump (not shown in FIG. 3). An inert gas such as argon and/or a reactive gas such as nitrogen are/is supplied via the inlet pipe 14 to the chamber 10.

The target 1 is formed of a target plate 1a and a backing plate 1b. The heat conductivity of the backing plate 1b is greater than that of the target plate 1a. The target plate 1a is formed, for example, of aluminum and has a diameter of 200 mm and a thickness of 6 mm. The backing plate 1b is formed, for example, of copper and has a diameter of 200 mm and a thickness of 7 mm. The target plate 1a is directly connected to the backing plate 1b by an explosive cladding process. That is, no solder is used to adhere the target plate 1a to the backing plate 1b. A sheet-shaped heater 1c is adhered to a rear surface of the backing plate 1b by a thermosetting adhesive, which rear surface is opposite to a surface on which the target plate 1a is provided. Ethylene glycol having a large heat capacity flows, as the heat exchanging medium 22a, in the flow path 9, so that the target 1, formed of the target plate 1a and the backing plate 1b is maintained at a constant temperature. The substrate 20 having a 4 inch diameter is placed on the supporting table 12 so as to be separated from the target plate 1a by 50-70 mm.

The chamber 10 is exhausted by the cryopump so that the pressure in the chamber 10 is maintained at $10^{-8}$-$10^{-9}$ Torr. Argon is supplied via the inlet pipe 14 to the chamber 10 by use of a massflow controller (not shown in FIG. 3) at a constant flow rate (10-150 sccm). The sputtering pressure is controlled at a value within a range of 1-15 mTorr. Before the sputtering on the target plate 1a starts, the sheet-shaped heater 1c is activated so that the target 1 is heated by the sheet-shaped heater 1c at a predetermined temperature higher than 150° C. That is, the target plate 1a is maintained at a temperature at which the residual gases absorbed on the surface of the target plate 1a are removed therefrom before the sputtering starts.

Then, and while maintaining, a predetermined power is supplied via the cathode assembly 3 to the target 1 so that the sputtering deposition is performed. That is, a plasma is generated adjacent to the surface of the target plate 1a so that the target plate 1a made of aluminum is sputtered at a temperature less than the melting point of the target plate 1a. As a result, a thin film of aluminum is deposited on the surface of the substrate 20.

According to the above embodiment, as the target 1 is heated at a predetermined temperature before the sputtering of the target plate 1a starts, the sputtering can be performed under a condition in which the residual gases have been removed from the surface of the target plate 1a. Thus, the amount of the residual gases included in the thin film deposited on the substrate 20 is decreased, so that the quality of the thin film is improved. In addition, as the target plate 1a is directly connected to the backing plate 1b by the explosive cladding process with the result that no solder is needed to adhere the target plate 1a to the backing plate 1b, the power supplied to the target 1 can be increased. That is, the sputtering can be performed in a state where the target 1 is maintained at a relatively high temperature. In a simulation in a simple model, when the power supplied to the target 1a was 8 (kW), the temperature at a position between the target plate 1a and the backing plate 1b formed of copper was 157° C. The temperature was calculated based on an assumption that the flow rate of the heat exchanging medium (water) was 8 (l/min.). In this case, the power density supplied to the target is 28 W/cm$^2$.

In a conventional case where the target plate of aluminum was adhered to the backing plate by the solder, the maximum power density which could be supplied to the target was 25 W/cm$^2$. In this case, the diameter of the target plate was 290 mm, and the thickness thereof was 10 mm. The diameter of the backing plate was 290 mm, and the thickness thereof was 8 mm.

In the above embodiment, as a relatively high power density can be supplied to the target in which no solder is used to adhere the target plate 1a to the backing plate 1b, the sputtering rate can be increased. If the sputtering can be performed under a condition in which the temperature of the surface of the target plate 1a formed of aluminum is 400° C., a power density of 70 W/cm$^2$ can be supplied to the target 1. In this case, the sputtering can be performed at a sputtering rate of 3 $\mu$m/min., which rate is approximately three times value of the conventional sputtering rate.

A thin aluminum alloy film forming a wiring pattern of a semiconductor device can be deposited on the substrate by sputtering which is performed under the above conditions. The target plate can be formed of pure aluminum, Al-1%Si, or Al-1%Si-0.5%Cu. However, in this case, the target actually used was formed of Al-1%Si.

The thin aluminum alloy film is deposited on the substrate by sputtering at a high sputtering rate, and then the aluminum thin film is patterned by a known photolithography process so that the wiring pattern is formed. In this case, the amount of residual gas included in the thin aluminum alloy film is less than that included in the thin film formed by the conventional sputtering process. As a result, a Mean-Time-To-Failure (MTF), which describes an electromigration resistance, is one order higher than that in the conventional case. Electromigration is a phenomenon in which the resistance of an aluminum wiring pattern is greatly increased and the wiring is ultimately disconnected while a constant current passes through the aluminum wiring pattern at a temperature within a range of 150-250° C.

When the aluminum alloy is deposited on the substrate which is maintained at a temperature within a range of 350-450° C., the flowability of the aluminum is improved. Thus, even if the surface of the substrate has roughness, the surface of the aluminum thin film deposited on the surface of the substrate can be smooth.

Figure 2:
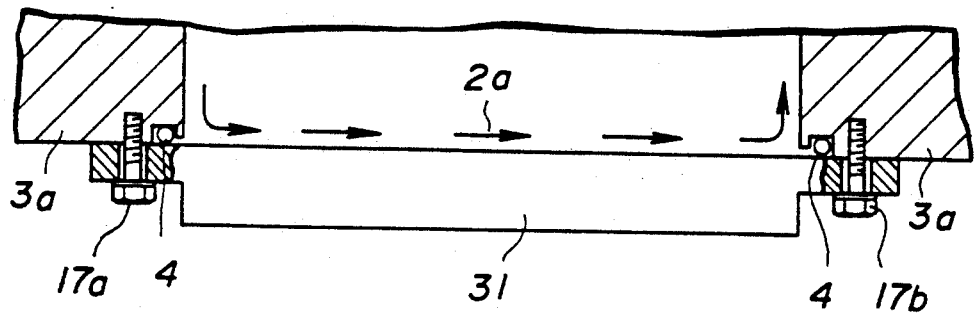
FIG. 2 is a diagram illustrating a conventional target used in the sputtering device.

In addition, the heat conductivity of the backing plate of this embodiment is 60% greater than that of the conventional target which is directly mounted on the cathode assembly, as shown in FIG. 2. Thus, the sputtering rate of this embodiment is 30% greater than that in the conventional case shown in FIG. 2.

A description will now be given of another embodiment in which a thin film formed of nitride or oxide is deposited on the substrate in which the reactive gas such as nitrogen or oxygen is supplied to the chamber.

In this case, the chamber 10 is exhausted by the cryopump so that the pressure in the chamber 10 is maintained at $10^{-8}$-$10^{-9}$ Torr. Argon is supplied via the inlet pipe 14 to the chamber 10 by use of a massflow controller (not shown in FIG. 3) at a constant flow rate within a range of 50-80 sccm. The sputtering pressure is controlled at a value within a range of 1-5 mTorr. Nitrogen gas (the reactive gas) is supplied to the chamber 10 at a relative flow rate in a range of 20-50 %. Before the sputtering on the target plate 1a starts, the sheet-shaped heater 1c is activated so that the target 1 is heated by the sheet-shaped heater 1c at a predetermined temperature greater than 150° C.

Then and while maintaining, electric power within a range of 5-10 kW (discharge voltage of 400-450 V) is supplied via the cathode assembly 3 to the target 1 so that the sputtering deposition is performed. As a result, the thin film of nitride or oxide is deposited on the surface of the substrate 20.

According to the above embodiment, since the target plate 1a is heated before the sputtering starts and the target plate 1a can be maintained at a temperature higher than that in the conventional case, the sputtering is performed under a condition in which the reactive gas absorbed on the surface of the target plate 1a is activated. Thus, the reactive gas can be effectively reacted while the sputtering is being performed. As a result, a high quality thin film formed of the nitride or the oxide can be deposited on the substrate by use of a small amount of reactive gas (the nitrogen or the oxygen). In the above case, the sputtering rate can be greater than that in the conventional case. For example, a sputtering rate of 1200 Å/min. was obtained in the above case. In the conventional case, the sputtering rate was 1000 Å/min.

The partial pressure of the reactive gas which was required for depositing the thin film of the nitride or the oxide on the substrate was obtained as follows.

Three types of targets were used in an experiment. A first target plate was formed of pure aluminum, a second target plate was formed of chromium, and a third target plate was formed of titanium. Each of the targets had a disk shape and each of the diameters thereof was 131 mm. The substrate 20 was placed at a position separated from the target plate 1a by 100 mm. The power supplied to the target was 1 kW, and the sputtering pressure was 5.0 mTorr. When a thin film of alumina ($Al_2O_3$) was deposited on the substrate 20 by use of the first target plate, the partial pressure of the oxygen required when the first target plate had a temperature of 150° C. was one fourth as large as that required when the first target plate had a temperature of 50° C. When a thin film of chromium oxide ($Cr_2O_3$) was deposited on the substrate 20 by use of the second target plate, the partial pressure of the oxygen required when the second target plate had a temperature of 300° C. was one third as large as that required when the second target plate had a temperature of 150° C. When a thin film formed of titanium nitride was deposited on the substrate 20 by use of the third target plate, the partial pressure of the nitrogen required when the third target plate had a temperature of 300° C. was half as large as that required when the third target plate had a temperature of 50° C.

Figure 5A:
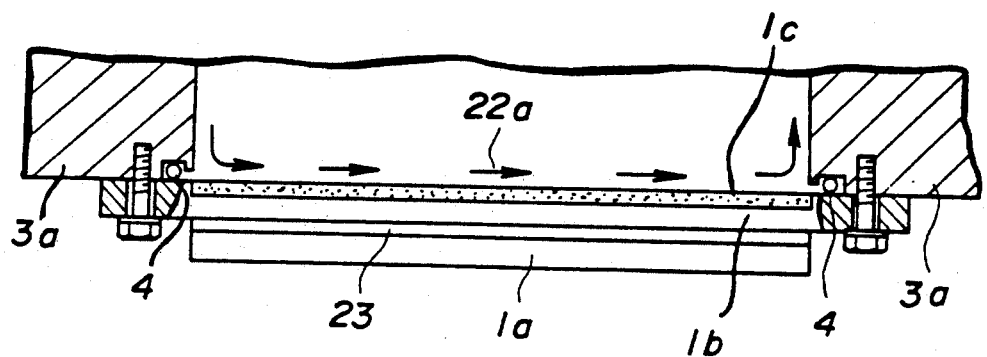
FIG. 5A and 5B are diagrams illustrating other examples of the target.

If the target plate 1a is formed of hard material, such as an aluminum alloy including an amount of silicon which is equal to or greater than 2% (Al-Si, Al-Si-X) or an aluminum alloy including an amount of magnesium which is in a range of 1-10%, it is difficult to directly connect the target plate to the backing plate formed of copper by the explosive cladding process. Thus, in this case, the target plate 1a, the backing plate 1b and a spacer 23 which is put between the target plate 1a and the backing plate 1b can be connected to each other by the explosive cladding process, as shown in FIG. 5A. The spacer 23 can be formed of aluminum, silver, or titanium. The melting point of the spacer 23 is higher than that of the target plate 1a, so that the spacer 23 does not melt when the target 1 is heated before the sputtering and the sputtering is performed. In a process for forming the target 1, to prevent the target from being contaminated, the spacer 23 is first connected to the backing plate 1b by the explosive cladding process, and then the target plate 1a is connected to the spacer 23 by the explosive cladding process. A target plate 1a formed of a high purity aluminum alloy, a spacer 23 formed of a low purity aluminum alloy and a backing plate 1b also formed of a low purity aluminum alloy can be connected to each other by the explosive cladding process.

The process for connecting the target plate and the backing plate to each other is not limited to the explosive cladding process as has been described above. Other processes in which solder is not used, such as a hot roll process, can also be used to connect the target plate and the backing plate to each other. A target plate formed of an aluminum alloy, a backing plate formed of copper, and a spacer, which can be easily adhered to both the target plate and the backing plate and formed, for example, of pure silver, titanium, or nickel, can be connected to each other by the hot roll process.

Figure 5B:
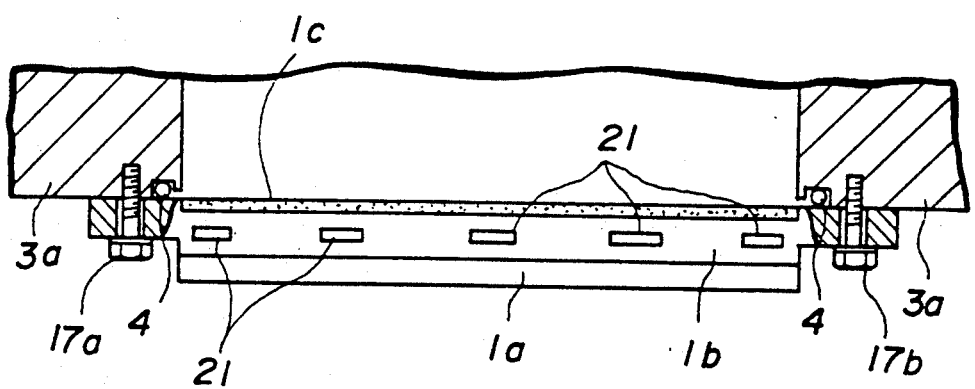

The flow path through which the heat exchanging medium, such as water, passes can be formed in the backing plate 1b as shown in FIG. 5B. In FIG. 5B, flow paths 21 are formed in the backing plate 1b to which the target plate 1a is adhered without using the solder.

Figure 4:
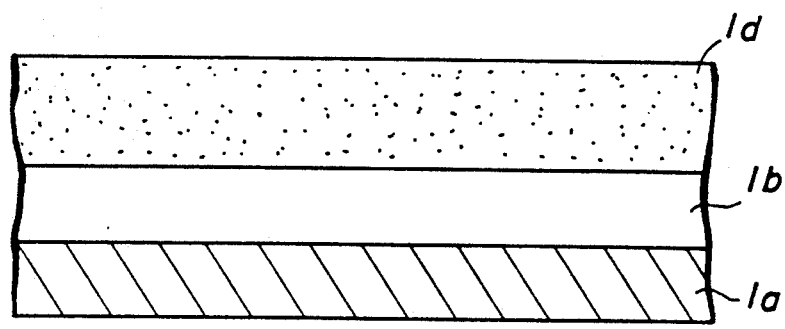
FIG. 4 is an enlarged cross sectional view showing an example of the target.

A cast heater can be used as the heater for heating the target 1 before the sputtering begins. In this case, a cast heater 1d is adhered to the rear surface of the backing plate 1b by a thermosetting adhesive, as shown in FIG. 4.

The target plate 1a can be formed of one of the following materials:
aluminum, an alloy in which aluminum is the chief ingredient, one of the metals titanium, zirconium, tungsten, molybdenum, gold, tantalum, niobium, palladium, manganese, silver, zinc, ruthenium, and tellurium, an alloy in which at least one of the above metals is the chief ingredient, chromium, nickel, a chromium alloy, a nickel alloy, magnetic metals such as permalloy, a silicon alloy of one of the metals titanium, tungsten and molybdenium, silicon, and an oxide of any of the above materials.

The backing plate 1b can be formed of copper, titanium, iron, aluminum, or an alloy in which one of these metals is the chief ingredient. It is preferable for the heat conductivity of the backing plate to be as high as possible and for the mechanical strength thereof to be as great as possible.

A liquid whose heat capacity is large, such as water and ethylene glycol, He gas, or $N_2$ gas can be used as the heat exchanging medium. It is preferable for the heat exchanging medium to have the function of maintaining the temperature of the target which is in contact with the heat exchanging medium at a constant value.

The present invention is not limited to the aforementioned embodiments, and variations and modifications may be made without departing from the scope of the claimed invention.

What is claimed is:

1. A method for depositing a thin film on a substrate placed in a chamber by a sputtering process in which a target mounted on a cathode assembly is sputtered under a predetermined ambient condition in the chamber, said method comprising:
    (a) mounting the target, which is formed of a backing plate and target plate directly connected to said backing plate, on the cathode assembly, said backing plate having a heat conductivity greater than that of said target plate;
    (b) evacuating the chamber and conducting heat through the backing plate of the target to the target plate thereof thereby to heat said target plate to a predetermined temperature at which residual gases absorbed on said target plate are removed therefrom; and then
    (c) activating said cathode assembly to thereby sputter said target plate.

2. A method as claimed in claim 1, further comprising:
    heating said target to a temperature greater than 150° C.

3. A method as claimed in claim 1, further comprising:
    heating said target to a temperature less than the melting point temperature of said target plate.

4. A method as claimed in claim 1, wherein said step (c) further comprises:
    supplying power from said cathode assembly to said target at a power density of at least 28 W/cm².

5. A method as claimed in claim 1, wherein said step (c) further comprises activating said cathode assembly to thereby sputter said target plate at a temperature less than the melting point temperature of said target plate.

6. A method as claimed in claim 1 further comprising:
    (d) supplying a reactive gas to said chamber during the sputtering process thereby to deposit the thin film including a component derived from said reactive gas on said substrate.

7. A method for depositing a thin film on a substrate placed in a chamber by a sputtering process in which a target mounted on a cathode assembly is sputtered under a predetermined ambient condition in the chamber, said method comprising:
    (a) mounting the target, which is formed of a backing plate, a spacer directly connected to said backing plate and a target plate directly connected to said spacer, on the cathode assembly, said spacer having a melting point temperature greater than the melting point temperature of said target plate;

(b) evacuating the chamber and conducting heat through the backing plate of the target to the target plate thereof thereby to heat said target plate to a predetermined temperature at which residual gases absorbed on said target plate are removed therefrom; and then (c) activating said cathode assembly to thereby sputter said target plate.

8. A method as claimed in claim 7, further comprising:

heating said target to a temperature greater than 150° C.

9. A method as claimed in claim 7, further comprising:

heating said target to a temperature less than the melting point temperature of said target plate.

10. A method as claimed in claim 7, wherein said step (c) further comprises:

supplying power from said cathode assembly to said target at a power density of at least 28 W/cm$^2$.

11. A method as claimed in claim 7, wherein said step (c) further comprises activating said cathode assembly to thereby sputter said target plate at a temperature less than the melting point temperature of said target plate.

12. A method as claimed in claim 7 further comprising:

(d) supplying a reactive gas to said chamber during the sputtering process thereby to deposit the thin film including a component derived from said reactive gas on said substrate.

* * * * *

UNITED STATES PATENT AND TRADEMARK OFFICE
CERTIFICATE OF CORRECTION

PATENT NO. : 5,244,556
DATED : Sep. 14, 1993
INVENTOR(S) : Minoru INOUE

It is certified that error appears in the above-indentified patent and that said Letters Patent is hereby corrected as shown below:

FRONT PAGE: [56] References Cited, under FOREIGN PATENT DOCUMENTS:

After Japanese reference "1-283368" change "7/1989" to --11/1989--;
After Japanese reference "1-283367" change "10/1989" to --11/1989--.

Col. 1,  line 26, after "films" insert --,--;
line 28, after "requirement" insert --,--;
line 30, delete "of residual" (second occurrence);
line 40, change "This" to --That--;
line 49, change "flow" to --glow--.
line 66, change "13b" to --3b--.

Col. 2,  line 31, after "point" insert --,--.

Signed and Sealed this

Ninth Day of August, 1994

Attest:

BRUCE LEHMAN

*Attesting Officer*                    *Commissioner of Patents and Trademarks*